United States Patent
Sato et al.

[11] Patent Number: 5,798,134
[45] Date of Patent: Aug. 25, 1998

[54] PROCESS FOR PRODUCING NICKEL OXIDE FILM

[75] Inventors: Yoshiyuki Sato; Shigeharu Tamura; Shoichi Mochizuki; Toshiyuki Mihara, all of Ikeda, Japan

[73] Assignee: Agency of Industrial Science & Technology, Tokyo, Japan

[21] Appl. No.: 833,089

[22] Filed: Apr. 4, 1997

Related U.S. Application Data

[63] Continuation of Ser. No. 539,261, Oct. 4, 1995, abandoned.

[30] Foreign Application Priority Data

Oct. 11, 1994 [JP] Japan .................. 6-272984

[51] Int. Cl.$^6$ .................. C23C 16/00; C23C 14/34
[52] U.S. Cl. .................. 427/126.6; 427/126.3; 427/419.2; 427/419.7; 427/255.2; 427/585; 204/192.15; 204/192.26; 204/192.29

[58] Field of Search .................. 204/192.1, 192.15, 204/192.16, 192.26, 192.29; 427/126.3, 126.6, 166, 255.2, 376.2, 376.3, 419.2, 419.7, 529, 530, 539, 585, 590

[56] References Cited

U.S. PATENT DOCUMENTS

| 4,525,417 | 6/1985 | Dimigen et al. | 204/192.16 |
| 5,030,331 | 7/1991 | Sato | 204/192.15 |

FOREIGN PATENT DOCUMENTS 62-156261  7/1987  Japan.

Primary Examiner—Robert Kunemund
Assistant Examiner—Rodney G. McDonald
Attorney, Agent, or Firm—Nikaido Marmelstein Murray & Oram, LLP.

[57] ABSTRACT

A process for producing a nickel oxide film characterized in that a composite film consisting of metallic nickel and carbon is heat-oxidized.

10 Claims, 3 Drawing Sheets

PROCESS FOR PRODUCING NICKEL OXIDE FILM

This application is a continuation of application Ser. No. 08/539,261 filed Oct.4,1995.

BACKGROUND OF THE INVENTION

The present invention relates to a process for producing a nickel oxide film capable of color development in an oxidized state and, more specifically, capable of "color development through electrolytic oxidation" thereof.

A phenomenon that a body in the form of a thin film discolors, develops a color or loses a color upon implantation therein of positively or negatively charged ions is called "electrochromism." This phenomenon is utilized in an electrochromic element. Typical electrochromic elements are made up of a reduction color-developing electrochromic material capable of color development through reduction thereof such as tungsten oxide, and an oxidation color-developing material capable of color development through oxidation thereof such as iridium oxide or nickel oxide.

Among wholly solid electrochromic elements, a tungsten oxide/iridium oxide electrochromic element has been most actively studied. Since iridium oxide is poor in color development efficiency, however, nickel oxide has recently been actively studied instead. Meanwhile, it is preferable that an electrochromic element be high in response speed and not substantially deteriorate, though this is a matter of course from the standpoint of putting the element into practical use. Where an oxidation color-developing electrochromic material is formed into an element in combination with a tungsten oxide film, the former must be turned into a transparent state because the tungsten oxide film formed by vacuum deposition, coating or the like is not subjected to ion implantation and is therefore transparent as in the formed state thereof. Nickel oxide is suitable as such an oxidation color-developing electrochromic element.

It is known that a nickel oxide film capable of exhibiting electrochromism can be formed according to a variety of methods since Svensson and Granqvist reported on the electrochromism of a nickel oxide film formed by sputtering in Applied Physics Letters, Vol. 64, 1986. More specifically, methods of obtaining a nickel oxide film that have been known to date include sputtering, vacuum deposition, electrodeposition, and sol-gel methods, which have however involved respective problems to be solved.

According to a paper of Carpenter et al. printed in Solar Energy Materials, Vol. 16, 1987, a nickel oxide film formed according to the electrodeposition method wherein a nickel oxide film is formed on a cathode, for example, in an aqueous solution of nickel nitrate was found out to be subject to such notable deterioration that the transmittance thereof in a state of color loss was lowered from higher than 90% in the initial stage through about 500 cycles of repeated color development and color loss to at most 50% after 500 cycles thereof. Furthermore, as for the response speed of that nickel oxide film, the color development thereof required 7 seconds, while the color loss thereof required 5 seconds.

According to a paper of Lampert and Caron-Popowich printed in SPIE Vol. 1149 Optical Materials Technology for Energy Efficiency and Solar Energy Conversion VIII, 1989, a nickel oxide film formed according to the sol-gel method was found out to be subject to such notable deterioration that the transmittance thereof in a state of color loss was lowered from higher than 80% in the initial stage through about 200 cycles of repeated color development and color loss to at most 50% after 200 cycles thereof. They also reported on the properties of nickel oxide films respectively formed according to the sputtering and vacuum deposition methods, among which properties the response speeds thereof were a few seconds to 10 seconds.

According to the above-mentioned paper of Svensson and Granqvist, it was reported that a nickel oxide film formed according to the sputtering method had a life span of about 10,000 cycles of color development and color loss. However, the electrochemical properties of that nickel oxide film have been unknown. According to a paper of Conell et al. printed in Solar Energy Materials and Solar Cells, Vol. 25, 1992, it was reported that a nickel oxide film formed according to the sputtering method had a life span exceeding 2,500 cycles of color development and color loss. According to their paper, the transmittance (in the visible light range) of that nickel oxide film in a state of color loss was lowered by a few e after 2,500 cycles as compared with that in the initial stage.

As described above, it was found out that a nickel oxide film formed according to the sputtering method is minimally in deteriorated. However, a nickel oxide film having a high transmittance in the as formed state thereof cannot be obtained by customary sputtering in an atmosphere of oxygen. Furthermore, there are no known methods of forming a nickel oxide film having a combinations of the properties of high response speed and low deterioration.

SUMMARY OF THE INVENTION

An object of the present invention is to provide a process for producing a nickel oxide film which is high in response speed and low in deterioration when used as an electrochromic element. As a result of extensive investigations in view of the foregoing status quo of the prior art, the inventors of the present invention have made a novel finding that a transparent nickel oxide film can be obtained when a composite film consisting of nickel and carbon is preliminarily formed on a substrate and is then is heat-oxidized in air according to a simple treatment involving a heat oxidation temperature of 400° C. and a heat oxidation time of 10 to 30 minutes. More specifically, an important feature of the present invention is that a nickel oxide film which is homogeneous and transparent over a large area thereof can be obtained by forming a composite film consisting of metallic nickel and carbon on a substrate, and subsequently heat-oxidizing the composite film in an atmosphere of a gas comprising oxygen.

Herein, the term "heat-oxidizing" or "heat oxidation" is intended to mean that the composite film is heated in an atmosphere of a gas comprising oxygen to oxidize nickel in the composite film.

The inventors of the present invention previously found out that an iridium oxide film capable of exhibiting good electrochromic properties can be obtained by heat-treating an iridium-carbon composite film in air at a temperature of about 250° C. according to a similar method, i.e., a method as disclosed in Japanese Patent Publication No. 57,707/1987. Since the iridium oxide film in the as formed state thereof is in a colored state as reported by one (Y. Sato) of the inventors of the present invention in Journal of the Electrochemical Society, Vol. 134 (1987), pp. 570–575, however, electrochemical reduction thereof must be effected in order to turn it into a transparent state. Such electrochemical reduction can be effected according to a method as disclosed by the inventors of the present invention in Journal of Applied Physics, Vol. 66 (1989), pp. 1,810–1,815 and U.S. Pat. No. 5,030,331. In view of the above, the fact that a nickel oxide film which is transparent in the a formed state thereof, can be obtained merely by heat-oxidizing a composite film consisting of nickel and carbon in air was unexpected.

DESCRIPTION OF THE PREFERRED EMBODIMENTS

According to the present invention, a nickel-carbon composite film is first formed on a substrate. Usable materials of the substrate include not only electroconductive materials such as copper, iron and aluminum, but also nonelectroconductive materials such as glasses and ceramics.

The nickel-carbon composite film can be formed by known metallization in vacuo such as vacuum deposition, known sputtering, or the like as is generally adopted in the formation of a thin film. More specifically, methods of forming a nickel-carbon composite film include (i) a cometallization method wherein nickel and carbon are evaporated from separate evaporation sources to form a composite film on one and the same substrate; and (ii) a method wherein sputtering in argon gas is effected using a target having nickel disposed on carbon to form a composite film.

A nickel-carbon composite film having an arbitrary compositional ratio can be obtained through control of the evaporation source. It has been found out that an oxide film can be well formed through heat oxidation of the composite film when the compositional ratio of nickel to carbon in the composite film is in the range of 0.2 to 0.3 (C:Ni=1: 0.2 to 0.3).

Additionally stated, when use is made of a substrate made of a nonelectroconductive glass, ceramic or the like, it is preferable to preliminarily form a transparent electroconductive film or an electroconductive metal film on the substrate and form thereon a nickel-carbon composite film in order to enhance the response of the resulting electrochromic element.

According to the present invention, the nickel- carbon composite film formed on the substrate in the foregoing manner is then heat-oxidized in an atmosphere of a gas comprising oxygen, such as air, to form the desired nickel oxide film. A heating temperature of about 400° C. will suffice.

A nickel oxide film obtained according to the process of the present invention is capable of remarkable color development through electrolytic oxidation thereof, and hence is very useful as an electrochromic element, a pH sensor, or the like.

EXAMPLE

The following Example will further clarify the features of the present invention.

Formation of Nickel Oxide Film

Figure 1:
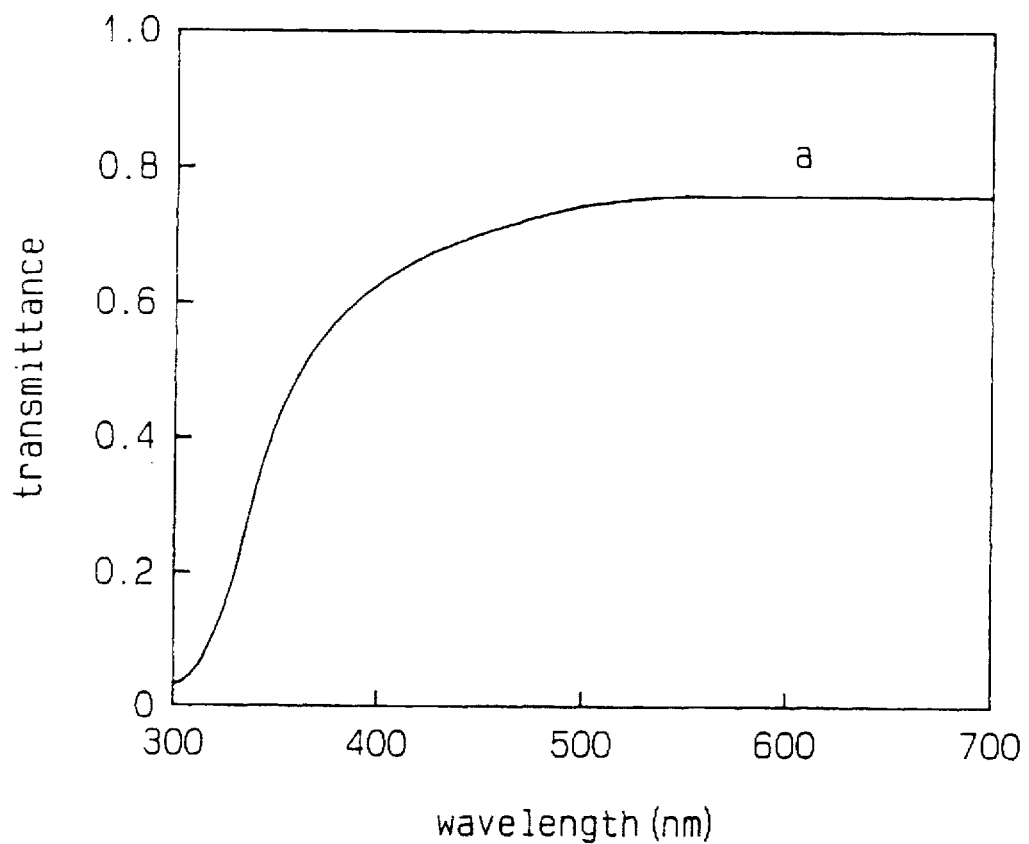
FIG. 1 shows the transmittances of a nickel oxide film produced according to the present invention.

By a vacuum deposition method, carbon was evaporated using an electron gun as the heating source and nickel was evaporated by resistance heating using a tungsten (W) boat, whereby a nickel-carbon composite film was formed on a substrate. The time required for film formation was a few to 10 minutes. Use was made of a substrate having a transparent electroconductive tin oxide film preliminarily formed on a glass plate. Subsequently, the nickel-carbon composite film was heat-oxidized in air at 400° C. for 10 to 30 minutes to form a nickel oxide film. FIG. 1 shows the transmittances at various wavelengths of the nickel oxide film thus obtained.

The thickness of the nickel-carbon composite film used for the formation of the nickel oxide film exemplified herein was about 100 nm. The ratio of nickel to carbon in the film was in the range of 0.2 to 0.3 as measured by photoelectron spectroscopy. As a result of examination of the structure of the heat-oxidized film by X-ray diffractometry, it was found out that the heat-oxidized film showed only a diffraction pattern corresponding to the cubic system of NiO with the disappearance of a diffraction pattern corresponding to metallic nickel. When the ratio of nickel to carbon in a film was about 3, a film having a high transmittance could not be obtained because of insufficient carbon elimination.

Color Development and Color Loss Test

Figure 2:
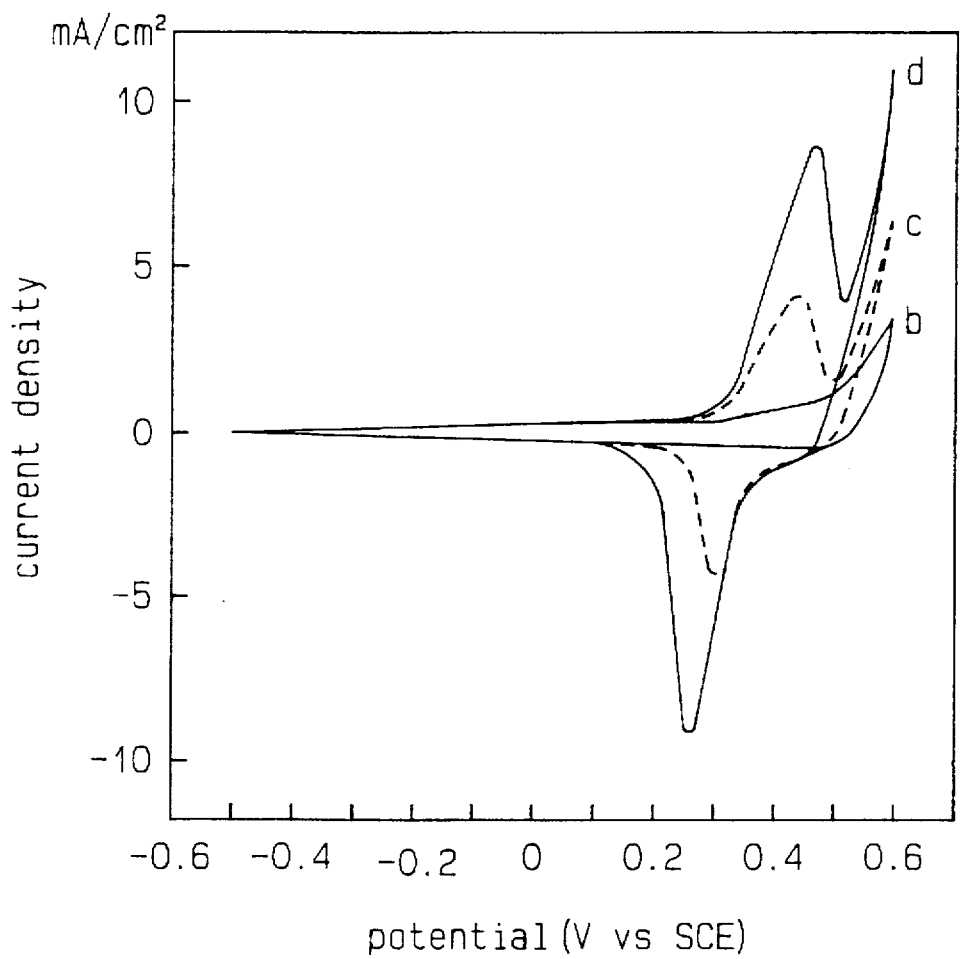
FIG. 2 shows changes in current density through the nickel oxide film at a potential scanning rate of 100 mV/sec as measured in the initial stage thereof, after 100 cycles and after 500 cycles.
Figure 3:
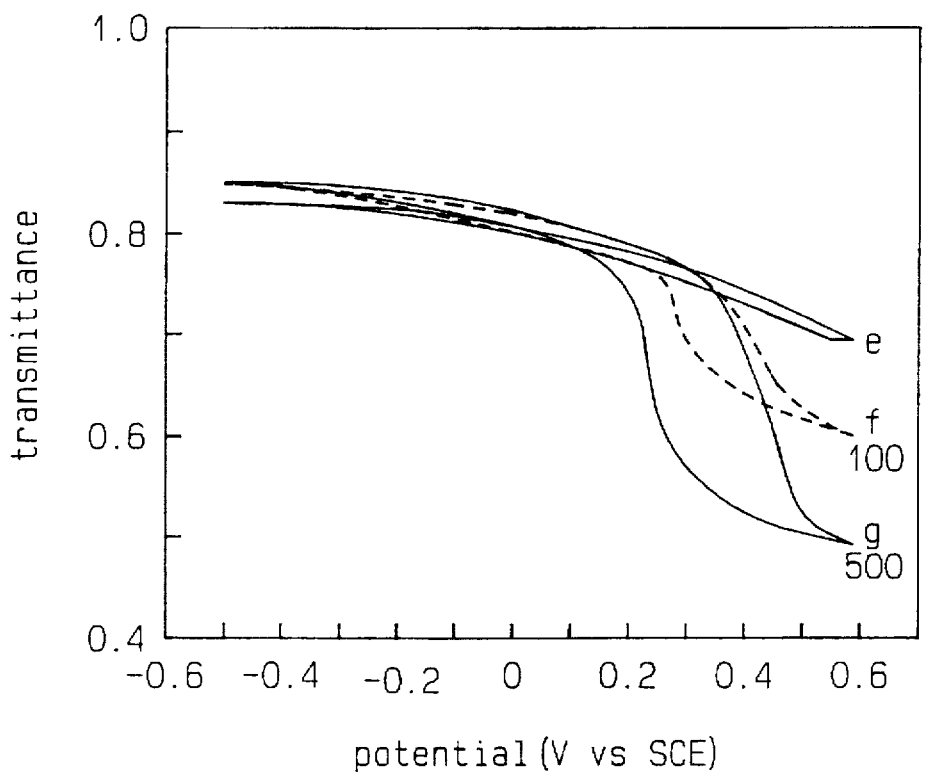
FIG. 3 shows changes in transmittance of the nickel oxide film at a wavelength of 633 nm at a potential scanning rate of 100 mV/sec as measured in the initial stage thereof, after 100 cycles and after 500 cycles.

The nickel oxide film formed on the transparent tin oxide electrode according to the present invention was immersed in a 1-mol aqueous solution of potassium hydroxide, while a saturated calomel electrode was used as the standard electrode. Potential scanning was carried out in the range of 0.6 to −0.5 V to bring about recognizable color development and color loss of the thin film. FIGS. 2 and 3 show changes in current density and changes in transmittance at a wavelength of 633 nm, respectively, when potential scanning was carried out at a potential scanning rate of 100 mV/sec. The curves e, f and g show changes in transmittance corresponding to the curves b, c and d, respectively. The curves b and e show changes in current density and transmittance, respectively, immediately after the start of potential scanning, the curves c and f in the 100th cycle after the start of potential scanning, and the curves d and g in the 500th cycle after the start of potential scanning. As is apparent from FIGS. 2 and 3, the changes in current density and the changes in transmittance were increased in keeping with repetition of potential scanning with no recognizable substantial deterioration of the thin film.

Cycle Life Span Test

Figure 4:
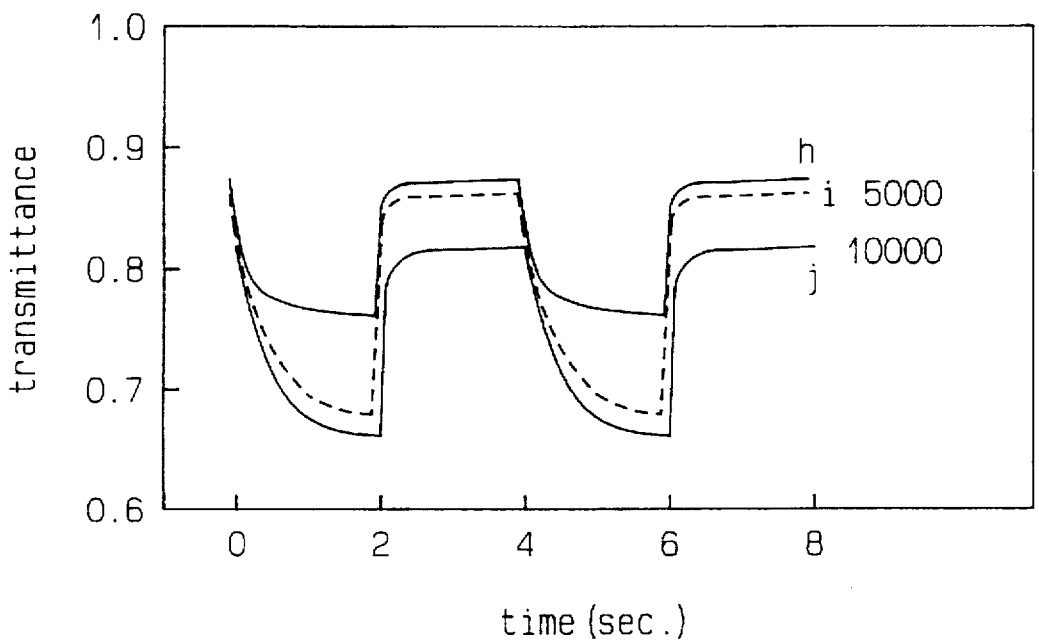
FIG. 4 shows changes in transmittance of the nickel oxide film at a wavelength of 633 nm in steps by the application thereto of step voltages as measured in the initial stage thereof, after 5,000 cycles and after 10,000 cycles.

The nickel oxide film formed on the transparent tin oxide electrode according to the present invention was immersed in a 1-mol aqueous solution of potassium hydroxide, while a saturated calomel electrode was used as the standard electrode. In order to examine the cycle life span of the nickel oxide film, a 4-second cycle of application of a step voltage in the range of 0.5 to −0.5 V was repeated. FIG. 4 shows changes in transmittance at a wavelength of 633 nm. The curves h, i and j show changes in transmittance immediately after application of the step voltage, after 5,000 cycles and after 10,000 cycles, respectively. It is understandable that the nickel oxide film exhibited excellent response properties, such as a response speed of about 1 second as shown in FIG. 4. The transmittances of the nickel oxide film during color loss were lowered in the following order: in initial stage >after 5,000 cycles >10,000 cycles, and so-called "remnant color" in a state of color loss was recognized. However, the nickel oxide film showed a transmittance of at least 80% even after 10,000 cycles.

As described hereinbefore, since a nickel oxide film is formed by forming a composite film consisting of metallic nickel and carbon on a substrate and subsequently heat-oxidizing the composite film in an atmosphere of a gas comprising oxygen according to the present invention, the nickel oxide film can be made homogeneous and transparent over a large area thereof and need not be electrochemically turned into a state of color loss in formation therefrom of an element because of the transparency thereof. Furthermore, this nickel oxide film is high in response speed and exhibits little in deterioration when used as an electrochromic element.

What is claimed is:

1. A process for producing a transparent, substantially uncolored, electrochemically colorizable, film comprising nickel oxide, comprising:

forming a composite film comprising metallic nickel and carbon on a substrate, and subsequently heat-oxidizing said composite film in an atmosphere of a gas comprising oxygen at a temperature of about 4000C under conditions sufficient to convert said composite film to a transparent, substantially uncolored, film comprising nickel oxide.

2. A process for producing a transparent, uncolored film as claimed in claim 1, wherein said substrate comprises an electroconductive material.

3. A process for producing a nickel oxide film as claimed in claim 2, wherein said electroconductive material is a metal.

4. A process for producing a transparent film as claimed in claim 1, wherein said substrate comprises a nonelectroconductive material, and has an electroconductive film disposed thereon in operative contact with said nickel and carbon.

5. A process for producing a nickel oxide film as claimed in claim 2 or 4, wherein said nonelectroconductive material is a glass or a ceramic.

6. A process for producing a nickel oxide film as claimed in claim 1, wherein said gas comprising oxygen is air.

7. A process for producing a transparent film as claimed in claim 4, wherein said electro conductive material comprises metal.

8. A process for producing a transparent film as claimed in claim 1, wherein said thermally oxidized film is transparent, and substantially uncolored in the as made condition without further processing.

9. A process for producing a transparent electrochromic film comprising nickel oxide which consists essentially of the steps of:

forming a film comprising metallic nickel and carbon, and then thermally oxidizing said film at a temperature of about 400° C. under conditions sufficient to convert said nickel to nickel oxide;

whereby directly forming a transparent, substantially uncolored film comprising nickel oxide.

10. A process for producing a transparent substantially uncolored, electrochromic film comprising nickel oxide which comprises:

forming a composite film comprising metallic nickel and carbon, thermally oxidizing said film in an atmosphere of a gas comprising oxygen and at a temperature of about 400° C. and under conditions sufficient to convert said composite film to a transparent, substantially uncolored, film comprising nickel oxide.

* * * * *

UNITED STATES PATENT AND TRADEMARK OFFICE
CERTIFICATE OF CORRECTION

PATENT NO. : 5,798,134
DATED : August 25, 1998
INVENTOR(S) : Sato et al.

It is certified that error appears in the above-identified patent and that said Letters Patent is hereby corrected as shown below:

Column 1, line 43, delete "Vol. 64" insert therefor

-- Vol. 49 --

Column 2, line 18, after "few" before "after" delete "e"

insert therefor -- % --

Column 5, line 23, delete "4000C" insert therefor -- 400° C --

Column 6, line 7, delete "electro conductive" insert therefor

-- electroconductive --

Column 2, lines 41 and 57; Column 3, line 57; Column 4, line 11; and Column 6, lines 19 and 30; after "400° C" delete "."

Signed and Sealed this

Sixteenth Day of February, 1999

Attest:

Attesting Officer

*Acting Commissioner of Patents and Trademarks*